United States Patent [19]

Henderson et al.

[11] Patent Number: 4,754,265

[45] Date of Patent: Jun. 28, 1988

[54] PHASE SHIFTER WITH SLOW TRANSITION DETECTOR

[75] Inventors: Elmer L. Henderson, Philadelphia, Pa.; Henry F. Inacker, deceased, late of Cinnaminson, N.J., by Joan A. Inacker, executrix; Michael P. Barnaba, Cherry Hill, N.J.

[73] Assignee: RCA Corporation, Princeton, N.J.

[21] Appl. No.: 786,529

[22] Filed: Oct. 11, 1985

[51] Int. Cl.$^4$ .............................................. G08B 21/00
[52] U.S. Cl. ................................... 340/653; 340/658; 361/86; 324/510
[58] Field of Search ........................... 324/51; 361/86; 340/645, 657, 658, 653

[56] References Cited

U.S. PATENT DOCUMENTS 4,005,361 1/1977 Lerner ................................... 324/51

OTHER PUBLICATIONS

An article entitled "Gold Metalization Enriches Silcon FETS", which appeared at pp. 107-113 of the Aug. 1985 of Microwave & RF magazine.

Primary Examiner—James L. Rowland
Assistant Examiner—Jeffery A. Hofsass
Attorney, Agent, or Firm—Clement A. Berard, Jr.; William H. Meise

[57] ABSTRACT

A phase shifter uses a PIN diode or diode pairs operated in a switching mode to switch transmission-line elements for phase-shifting radio frequency or microwave signals. A drive circuit for each diode(s) includes a FET switch controlled by a first level of a bilevel control signal to apply B+ to forward bias the diode(s) with a forward current. When forward biased, the active region of the diode(s) becomes flooded with charge carriers. The first FET switch is turned OFF by a second level of the bilevel control signal, and a second FET switch is turned ON to apply a reverse bias voltage to the diode(s) to render them nonconductive. Before the diode(s) become nonconductive, the excess charge carriers must be swept out of the diode(s). To achieve fast switching, the second FET switch must draw a large current for a short time as the excess charge carriers are removed. In a phased-array antenna, it is difficult to locate defective components, and very difficult to locate a driver circuit/diode combination suffering from low switching speed. A monitor circuit includes a voltage divider which in effect translates the diode voltage to an input terminal of an EXOR gate. The control signal is applied to the second input terminal. The EXOR produces a fault indicative level for a short time after a transition of the control signal. A strobe timed to occur during this interval latches the fault indicative signal and the latched level is sent to a central monitor location and also lights a lamp at the module in which the defect occurs.

20 Claims, 4 Drawing Sheets

PHASE SHIFTER WITH SLOW TRANSITION DETECTOR

This invention relates to electrical phase shifters and more particularly to sensors for detecting slow switching time of switching elements in switchable phase shifters.

BACKGROUND OF THE INVENTION

Many types of transmitting and receiving systems use phased array antennas. It is often desirable to change the direction of radiation of such a phased array antenna. This might be the case in a phased array antenna used for shipboard or airborne radar, or for a phased array antenna located on an on Earth satellite for changing its "footprint" on the Earth to match the shape of a particular land mass.

Control of the preferred direction of radiation of a phased array antenna is accomplished by selecting the phase of the signals applied to the antenna elements in a manner well known in the antenna arts. Similarly, due to the reciprocity of transmission and reception as also well known in the antenna arts, the direction from which a phased array receiving antenna receives signals can be established by the phasing of the signals applied from the antenna elements to a common summing point. In those cases in which changes in the direction of radiation of a phased array antenna is desired during operation, it is common to employ variable phase shifters located in the various feed structures of the individual antenna elements and to control those phase shifters to achieve the desired result. Analog phase shifters using variable reactance elements such as variable capacitance diodes can be used to achieve the desired phase shifts. However, such analog phase shifters are not well adapted to highly accurate remote control such as is necessary in many applications. For highly accurate remote control phase shifts, switching type phase shifters are normally used. Switching type phase shifters employ controllable switches to couple various predetermined lengths of transmission line into and out of circuit. As known, the introduction of an incremental length of transmission line into a transmission line causes a differential phase shift of the signal passing therethrough.

Modern designs use semiconductor switching elements for switching type phase shifters. The diodes are driven with a forward current to reduce their ON (conductive) condition resistance to allow the signal being phase shifted to flow therethrough, and are biased with a reverse bias voltage to turn them OFF (nonconductive) to prevent the flow of signal therethrough. It has been found that for many high power applications such as for phased array radar, PIN type diodes are preferable to PN junction diodes.

No matter which type of diode is used, a driver circuit is required for providing the bias for maintaining the diode in the ON or in the OFF condition. When high power is to be handled, the signal currents and voltages may be large. Consequently, operation of the diode as a switch requires relatively large bias currents and voltages. When the bias source applies a large forward current to a diode to switch it into the ON condition, the junction region becomes flooded with excess charge carriers. When a reverse voltage is thereafter applied to the diode to switch it to the OFF condition, these excess charge carriers provide continued conduction through the junction region, and therefore the diode does not immediately turn off as to the signal being phase shifted, even though no forward bias current is applied. Many applications of phased array radars require that the direction of radiation (or reception) be changed quickly, and this in turn requires high speed operation of the phase shifters. That portion of the switch driver circuit of a phase shifter which provides the reverse voltage bias must be capable of carrying a high current in order to quickly extract the excess charge carriers and thereby render the diode nonconductive. U.S. Pat. No. 4,005,361 issued Jan. 25, 1977, to Lerner describes such a driver circuit in which an active switch provides forward bias current to the switching diode and to a resistor. When the active switch turns OFF, the resistor provides the reverse bias voltage. For the diode to turn OFF quickly, the resistor must have a low resistance. This low resistance is disadvantageous in that a large amount of power is dissipated therein during the ON time of the active switch. The high currents and voltages which must be handled by the driver circuit for switching diodes used in the phase shifters of high power equipment such as radars tend to cause failure of the switching diodes and of driver transistors.

A large phased array antenna may have more than 4000 antenna elements. Each antenna element includes a phase shifter which musst be capable of shifting phase in relatively small increments. The number of elements in a phase shifter for an antenna array is minimized by causing the electrical length of the elements of the phase shifter to follow a binary progression. For example, an increment size or phase granularity of 22.5° may be accomplished by a phase shifter including switchable elements having electrical lengths of 180°, 90°, 45° and 22.5°. Any phase shift ranging from 0° to 337.5° in 22.5° increments may be obtained by combinations of these various elements. Each of the four elements may be switched ON or OFF, and corresponds to one bit. Thus, a four bit phase shifter is capable of 22.5° increment size or granularity. It is not uncommon to have each antenna element associated with four or more phase shifter elements. It can be seen that a large antenna array with a fine granularity may require a very large number of phase shift elements, each of which must be operated by a driver. Because of the large number of phase shifter elements, a failure of one or even several drivers or their associated diodes may go unnoticed, as the amount of degradation of the overall system is small. Even if the degradation is noticed, it is very difficult to locate a defective element in a large array. The problem of locating defective elements is even worse for an element which has not grossly failed but is simply degraded. For example, a degradation of the switching time of one or several diodes may cause a degradation in the rate of slew of the pointing direction of the antenna which is not perceptible to humans but which may be significant in terms of the mission to be accomplished. Location of a phase shifter element having degraded switching speed is extremely difficult in a large array. Consequently, there is a need for automatic self-test of the condition of drivers and diodes in a large array. The aforementioned Lerner patent describes a circuit for monitoring the accuracy of the phase shift produced in a radio frequency power distribution network including diodes. In the Lerner arrangement, analog diode voltages are multiplexed under the control of the digital computer and applied to comparators for comparison with reference voltages. The resulting comparison produces a digital signal which is applied to a digital computer for evaluation and generation of an alarm signal. In a large phased array antenna system, especially one handling high power signals, it is very undesirable to multiplex analog signals or to run analog signals over conductors of any significant length, because of the mutual coupling and interference problems which may arise. Furthermore, in systems having high slew rates which require fast switching speeds, it may not be possible to dynamically measure the condition of the diodes because of the delays introduced by the long line lengths.

SUMMARY OF THE INVENTION

An error sensing arrangement for a switching diode and driver circuit produces a signal representative of slow turnoff of the diode. The arrangement includes a diode coupled between first and second terminals. The second terminal is coupled to a point of reference potential. First and second power buses provide volages of mutually opposite polarities relative to the reference potential. A source of control signals provides bilevel control signals for turning diode on in response to a first level and turning the diode off in response to a second level. A first switch is coupled to the first power bus, to the first electrode of the diode and to the source of control signals for being rendered conductive by the first level of the bilevel control signal and for being rendered nonconductive by the second level of the bilevel control signal. In the conductive state of the first switch, forward current flows in the diode from the first power bus and the diode becomes flooded with charge carriers which must be removed before the diode can be turned off. A second switch is coupled to the first electrode of the diode, to the second power bus, and to the source of bilevel control signals and is rendered conductive for at least an interval which immediately follows each transition from the first to the second levels of the bilevel control signal. When the second switch is conductive, a reverse current is drawn from the diode which removes the charge carriers. At a predetermined time after the second switch is rendered conductive, the voltage at the first terminal of the diode will be closer the voltage of the first bus than to the voltage of the second bus if the reverse current is undesirably low, and closer to the voltage of the second bus than to the voltage of the first bus if the reverse current is high. A logic circuit coupled to the source of bilevel control signals and to the first terminal of the diode compares the bilevel control signal with the voltage at the first terminal of the diode to produce a signal indicative of a fault if the voltage at the first terminal of the diode is closer than a predetermined amount to the voltage on the first power bus at a predetermined time after the second switch is rendered conductive.

DESCRIPTION OF THE DRAWING

FIGS. 3a-3k illustrate amplitude-time waveforms representing voltages and currents occurring in the arrangement of FIG. 2 during normal operation; and FIGS. 4a-4k are similar to FIGS. 3a-3k, but represent the voltages and currents occurring under fault conditions.

DESCRIPTION OF THE INVENTION

Figure 1:
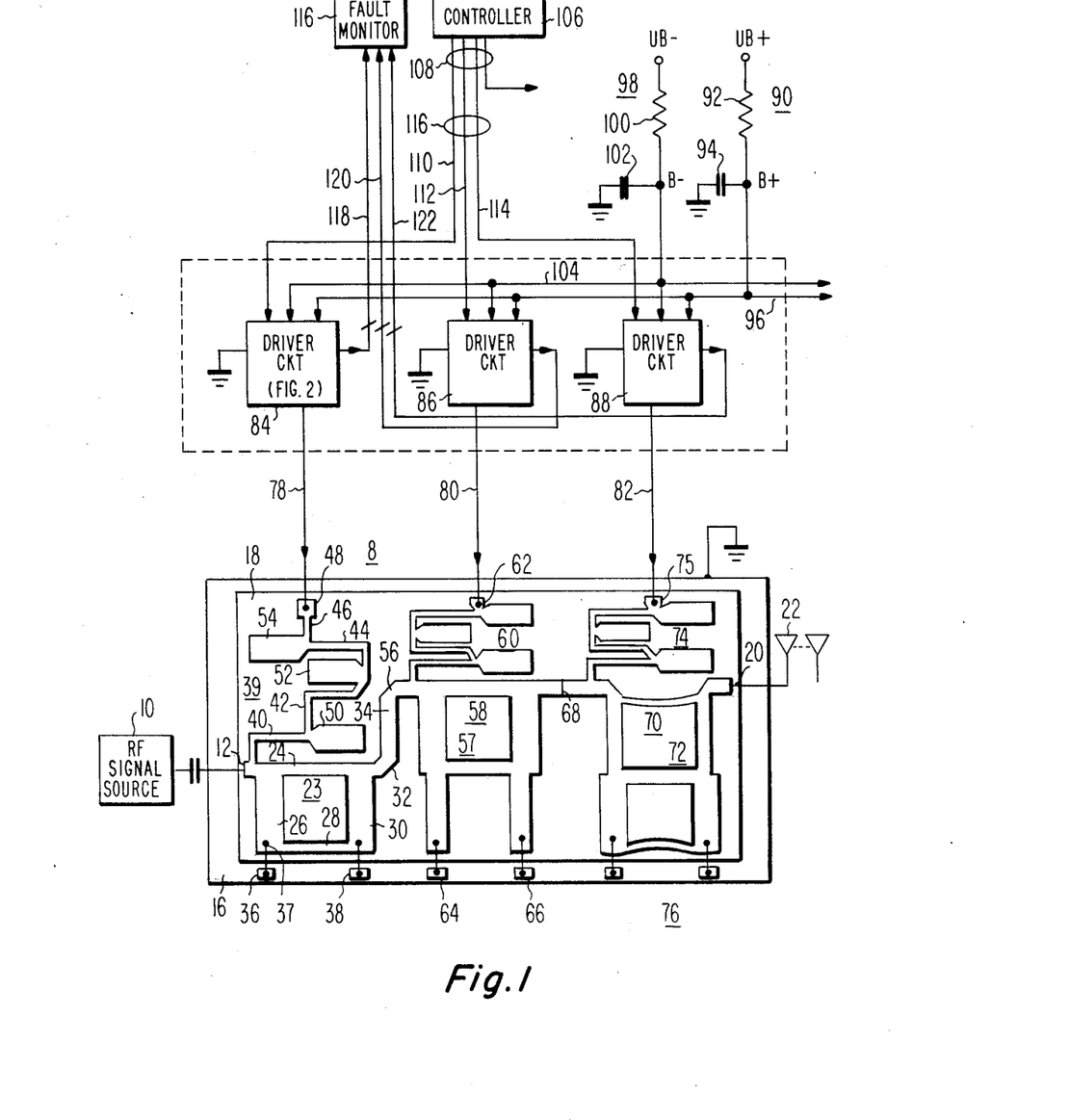
FIG. 1 illustrates, partially in block diagram form and partially in pictorial form, a three-bit microwave frequency electrical phase shifter which is part of a phased array antenna system, together with driver circuits, power supplies, a phase shift controller and fault monitor in accordance with the invention.

A radio frequency (RF) or microwave signal is applied from a signal source 10 to an input port 12 of a three-bit phase shifter designated generally as 8 which includes three phase shift elements 23, 58 and 70. Phase shifter 8 is of the switching type, and includes a conductive ground plane 16 onto which a flat plate 18 of dielectric material such as alumina is mounted. Alumina plate 18 has printed on it a conductor pattern of which together with ground plane 16 defines a transmission line path from input port 12 to an output port 20. Output port 20 is connected to an antenna element 22 which is one element of an array of antennas, each of which is controlled by an individual phase shifter. The principal transmission line path between ports 12 and 20 includes a printed conductive path including a portion 24 which is part of phase shifter element 23. Since phase shifter elements 23, 58 and 70 are similar, only element 23 is described in detail. Path 24 of phase shifter element 23 is paralleled by a conductive path including serially arranged portions 26, 28 and 30. A further short transmission line portion 32 extends from the junction of portions 24 and 30 to a discontinuity in the form of a gap 34. Gap 34 marks the transition between phase shifter elements 23 and 58. The lengths of transmission line elements 24-30 represent a significant portion of a wavelength at the frequency of the RF signal from source 10. A first PIN diode 36 has its cathode bonded to ground plane 16 adjacent a point 37 at the junction of conductive portions 26 and 28, and its anode is bonded by a bond wire (not separately designated) to point 37. A PIN diode 38 has its cathode bonded to ground plane 16 and its anode coupled by a bond wire to a point at the juncture of conductive portions 28 and 30.

A low pass filter 39 including thin conductive paths 40, 42, 44 and 46 provides galvanic (direct-current) continuity between a drive terminal metallization 48 and conductors 24-32 so that bias drive may be applied to diodes 36, 38 without attenuation of the RF signal being phase shifted. This attenuation might occur due to leakage of signal from source 10 into the driver circuits (described below). Because of the narrow width of conductors 40-46, they correspond to inductances at the frequency of the signals from source 10. Conductors 40-46 are formed into a low pass filter with the aid of wide conductive portions 50,52 and 54 coupled to points lying between thin conductive elements 40, 42; 42,44; and 44,46, respectively. Wide elements 50-54 are effectively capacitances to ground which coact with the inductances of conductive portions 40-46 to form a low pass filter between conductive transmission line elements 24-32 and drive or bias terminal 48. The elements so far described are the radio frequency portions of single bit or element 23 of three bit phase shifter 8.

Signals are coupled from conductor portion 32 across gap 34 to a further conductive portion 56 by a series capacitor (not illustrated). Conductive portion 56 is part of a second bit or element 58 of phase shifter 8 which includes transmission line elements (including portion 56) designated generally as 57, a low pass filter 60 extending between a bias terminal 62 and transmission line portions 58, and a pair of diodes 64, 66 bonded to ground plane 16 and coupled to the junctions of portions of transmission line elements 57 as in element 23. Signals traversing transmission line portion 57 of the second bit 58 of phase shifter 8 are coupled across a gap 68 by a capacitor (not illustrated) to a third bit or element 70 of phase shifter 8. Element 70 includes transmission line portions designated generally as 72, a low pass filter 74, and diodes designated collectively as 76. Output port 20 of phase shifter element 70 is connected to antenna 22.

Bias terminals 48, 62 and 75 receive bias signals for application to diodes 36, 38; 64, 66; and 76, respectively, from conductors 78, 80 and 82, respectively. Each conductor 78–82 is driven by a driver circuit 84, 86 and 88, respectively. Each driver circuit 84–88 provides monitor functions. A source UB+ of unfiltered voltage which is positive with respective ground applies power by way of a filter 90 including a series resistor 92 and a shunt capacitor 94 and by way of a conductor 96 to driver circuits 84–88. Similarly, a source UB− of unfiltered voltage which is negative with respect to ground provides power by way of a filter 98 including a series resistor 100 and a shunt capacitor 102 and by way of a conductor 104 to driver circuits 84–88. An antenna direction controller 106 produces on a multiconductor cable 108 control signals for controlling each bit of each phase shifter in the entire array. Among the conductors 108 are three conductors 110, 112 and 114 which are designated together as 116. These three conductors 110–114 jointly carry digital signals representing the amount of phase shift to be produced between ports 12 and 20 of phase shifter 8. As is known, conductor 110 carries the least significant bit (LSB) of the control signal, conductor 112 carries a bit of intermediate significance, and conductor 114 carries the most significant bit (MSB). Corresponding phase shifters 23, 58 and 70 may have phase shifts of 45°, 90° and 180°, thereby providing a granularity of 45°. The signal on each of conductors 116 is a binary (ON-OFF) signal as is well known in the digital arts. Each of the binary signals on a conductor 110–114 sets its corresponding driver 84–88 to one of two conditions. When the signal on one of conductors 110–114 is a logic one level or a logic high (HIGH), the corresponding driver circuit produces a forward bias current on its corresponding output conductor 78–82. When the voltage on a conductor 110–114 is a logic zero or logic low (LOW), the corresponding driver circuit produces on its output conductor a large negative voltage with respect to ground which is applied to the diode switches. For example, the forward drive current and the reverse bias voltage produced by driver circuit 84 on conductor 78 is applied by way of bias terminal 48 through conductors 46, 44, 42 and 40, and by way of conductive paths including transmission line portions 24–30 to the anodes of diodes 36 and 38. Since diodes 36 and 38 are separated by transmission line portion 28 which has a length which is a significant portion of a wavelength at the RF signal frequency, the diodes are not in parallel as to the RF signal. However, diodes 36 and 38 are in parallel as to the bias currents and voltages, and each therefore receives the full reverse bias voltage and one half of the forward bias current. The bias currents and voltages produced on conductor 80 by driver circuit 86 are applied by way of terminal 62 and filter 60 to transmission line portions 57 and to the anodes of dioes 64 and 66. Driver circuit 88 biases diodes 76 by way of conductor 82, terminal 75, filter 74 and transmission line portions 72. As mentioned, low pass filters 39, 60 and 74 prevent the radio frequency or microwave signals flowing in the transmission line portions of phase shifter elements 23, 58 and 70 from being shunted away onto ancillary control circuits.

As also mentioned, the large number of control circuits and phase shifting circuits in a large array, and their complexity, makes fault monitoring difficult. In accordance with an aspect of the invention, each of driver circuits 84, 86, 88 is coupled by a multiconductor cable 118, 120 and 122, respectively, to a fault monitor 116.

Figure 2:
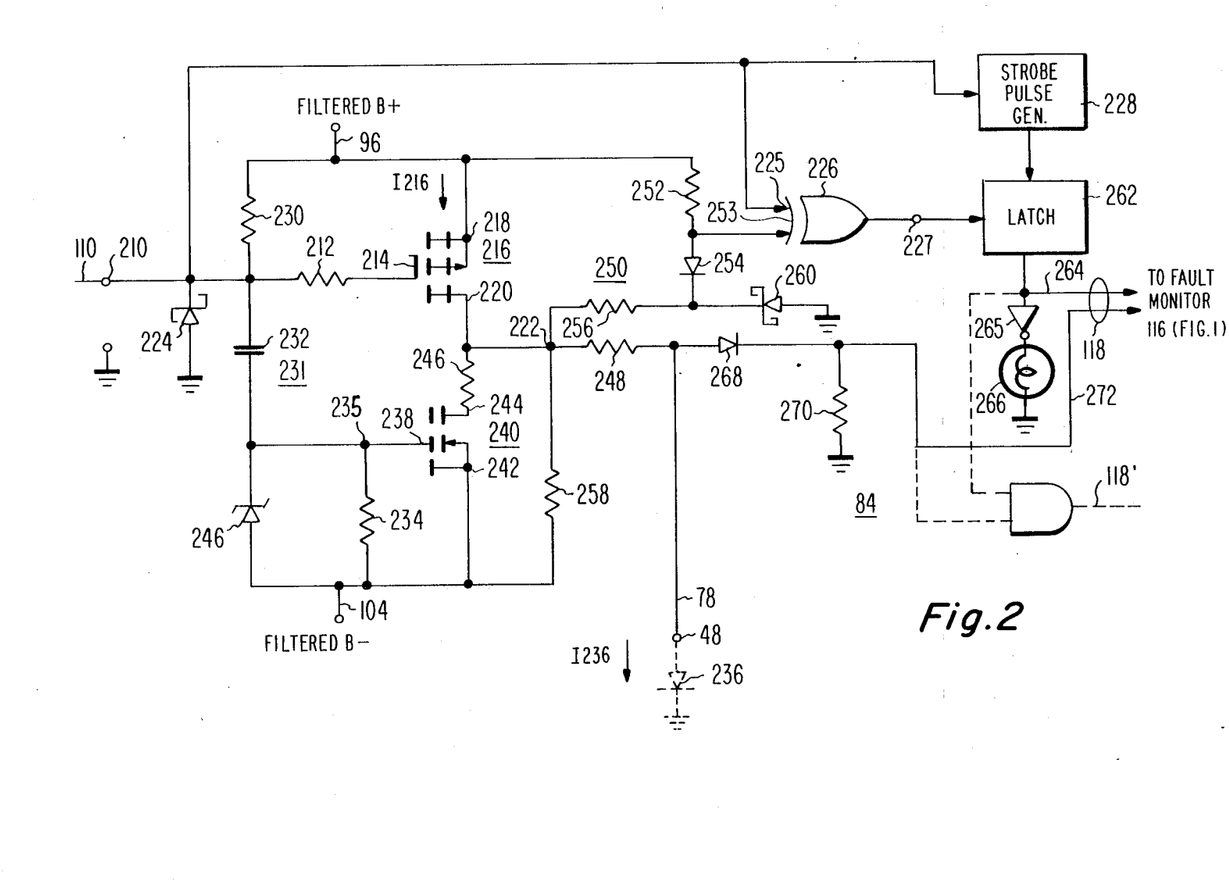
FIG. 2 is a schematic diagram of a driver circuit adapted for driving one bit of the phase shifter of FIG. 1 and for generating fault indicative signals in accordance with the invention.

Driver circuits 84–88 are identical, and therefore only driver circuit 84 is described in detail. FIG. 2 is a schematic diagram of driver circuit 84. In FIG. 2, elements corresponding to elements of FIG. 1 are designated by the same reference numeral. The arrangement of FIG. 2 receives a binary or bilevel control signal from conductor 110 at an input terminal 210 and responds by producing forward bias current or reverse bias voltage which is applied over conductor 78 to terminal 48 at the bottom of FIG. 2. A PIN diode 236 illustrated in phantom represents the parallel combination of PIN diodes 36 and 38 of FIG. 1. Also, the arrangement illustrated in FIG. 2 produces fault indicative signals on multiconductor set 118 which are representative of the operating state of driver 84 coacting with its associated diode 236.

Figure 3:
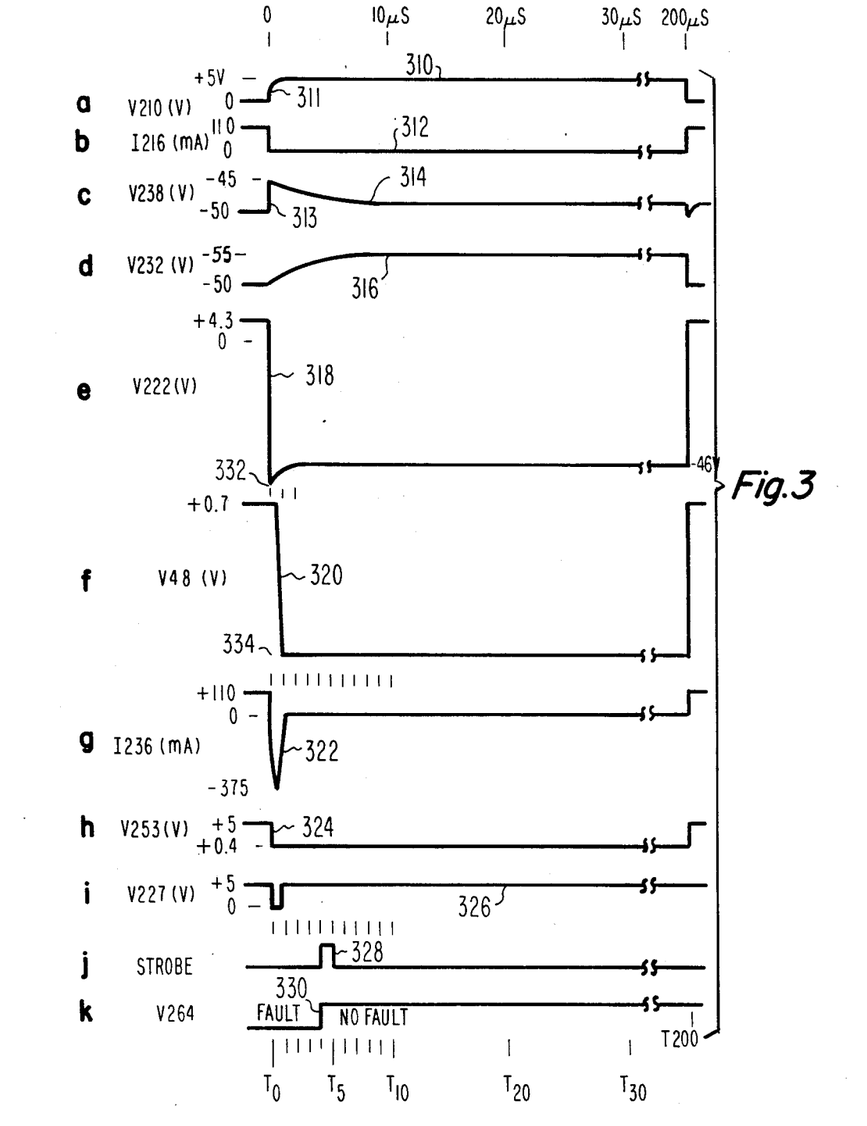

The binary signals applied to terminal 210 are coupled by way of an oscillation suppressing resistor 212 to the gate 214 of a P-channel enhancement mode field effect switching transistor (FET switch) designated generally as 216. The source 218 of FET switch 216 is coupled to conductor 96 to receive filtered B+ voltage (B+). The drain 220 of FET switch 216 is connected to a node 222. The cathode of a Schottky-barrier (hot-carrier) diode 224 is connected to terminal 210, and its anode is connected to ground for preventing application of reverse (negative polarity) voltages to terminal 210. The control signals applied to terminal 210 are also coupled to the input of an exclusive-OR gate (EXOR) 226 and to a strobe pulse generator 228 which generates a strobe pulse at a predetermined time after each HIGH-to-LOW transition of the control signal. A resistor 230 is coupled to B+ and to terminal 210 for aiding in the biasing of gate 214. A resistance capacitance (RC) differentiator designated generally as 231 has an electrode of its capacitor 232 connected to input terminal 210, one end of its resistor 234 connected to conductor 104 for receiving filtered B-voltage (B−), and its output terminal 235 connected to a gate 238 of an N-channel enhancement mode FET switch designated generally as 240 for differentiating input signal 310 (FIG. 3a) applied to input terminal 210 and for applying the differentiated signal 314 of FIG. 3c to gate 238 for turning FET switch 240 ON for an interval following each positive-going transition 311 of input signal 310. The voltage across capacitor 232 is illustrated as 316 of FIG. 3d. A Zener diode 246 has its anode connected to B− and its cathode connected to node 235. The Zener breakdown voltage of diode 246 is larger than the voltages appearing across resistor 234 during normal operation, and its major function is to protect FET switch 240 against excessive gate-to-source voltages at initial turn-on of the circuit. The source 242 of FET switch 240 is connected to B−, and its drain 244 is connected by way of resistor 246 to node 222. Node 222 is connected by a low-value resistor 248 to conductor 78, terminal 48 and to the anode of diode 236.

As so far described, driver circuit 84 operates in the following manner. Prior to a time $T_0$ (FIG. 3), the control signal 310 applied to input terminal 210 is LOW or zero volts relative to ground, FET switch 216 is ON (conductive) to conduct a current $I_{216}$, which is illustrated as 312 of FIG. 3b, and FET switch 240 is OFF (nonconductive). Forward bias current for diode 236 flows through the source-to-drain path of FET switch 216, through resistor 248, conductor 78 and terminal 48 to produce a current $I_{236}$ in diode 236 which is illustrated as 322 in FIG. 3g. The magnitude of current $I_{236}$ is established by the magnitude of the forward or ON resistance of FET switch 216, the resistance of resistor 248 and the forward or ON resistance of diode 236. As a result of this forward current, the active region of diode 236 is flooded with excess charge carriers. As mentioned, the excess charge carriers allow conduction of diode 236 to continue after time $T_0$, which in the context of phase shifter 8 of FIG. 1 means that diodes 36 and 38 undesirably remain conductive to RF signals after the time the control signal directs that they be nonconductive.

At time $T_0$, control signal 310 makes a positive-going excursion 311 to a HIGH condition, thereby immediately rendering FET switch 216 nonconductive and reducing its current to zero as illustrated by current $I_{216}$ in FIG. 3b. Differentiated control signal 314 applied to gate 238 of FET switch 240 by differentiator 231 renders FET switch 240 conductive beginning at time $T_0$ until a later time such as $T_1$. Time $T_1$ is determined by the time constant of the differentiator and the threshold gate voltage of FET switch 240. With FET switch 216 nonconductive and FET switch 240 conductive, a reverse bias current flows through diode 236, resistors 248 and 246, and FET switch 240 to B—, thereby sweeping the excess charge carriers out of the active region of diode 236 to produce a pulse in diode current $I_{236}$ as illustrated by current 322 of FIG. 3g in the interval $T_0-T_1$. The magnitude of this pulse is limited only by the resistances of resistors 246, 248 and the "ON" resistance of FET 240. After the charge carriers are swept out of diode 236, diode 236 becomes nonconductive both to alternating currents and to direct current.

At times after $T_1$, diode 236 remains nonconductive as illustrated by current 322 until a later time $T_{200}$ at which the control signal 310 (FIG. 3a) makes a negative going transition to a logic zero level, at which time FET switch 216 once again becomes conductive to produce a forward current in diode 236.

The remainder of the circuits illustrated in FIG. 2 relate to monitoring of the operating state of driver 84 and diode 236. A multielement voltage divider designated generally as 250 includes a resistor 252, the anode-cathode path of a diode 254, a resistor 256 and a resistor 258 serially coupled between B+ and B—. The junction of resistors 256 and 258 is connected to node 222, the junction of resistor 252 and the anode of diode 254 is connected to an input terminal 253 of EXOR 226, and the voltage at the junction of resistor 256 and the cathode of diode 254 is limited (prevented from going more than a few tenths of a volt negative with respect to ground) by a Schottky diode 260, the anode of which is connected to ground and the cathode of which is connected to the cathode of diode 254. The voltage $V_{253}$ at input terminal 253 of EXOR 226 is illustrated as 324 of FIG. 3h. The output voltage $V_{227}$ of EXOR 226 at output terminal 227 in response to input signal 310 and voltage 324 of voltage divider 250 is illustrated as 326 of FIG. 3i. The EXOR output voltage $V_{227}$ is applied to a latch 262 for being latched at a time $T_4$ by a strobe pulse illustrated as 328 in FIG. 3j, which is produced by pulse generator 228 at fixed time $T_4$ after transition 311 at time $T_0$. The signal produced by latch 262 is applied over a conductor 264 of conductor set 118 to fault monitor 116 of FIG. 1 where a signal is generated indicating a fault condition. The signal generated by latch 262 is also applied to a fault indication lamp 266 located on the housing of the associated driver to provide to a technician an immediate visual indication of the driver with which the fault is associated.

The anode of a diode 268 is connected to terminal 48, and its cathode is connected to ground by a resistor 270. The cathode of diode 268 is also coupled to a conductor 272 of conductor set 118. Under normal operating conditions, forward bias applied to diode 236 by way of FET switch 216 raises the voltage at terminal 48 of few tenths a volt positive with respect to ground. If diode 236 should fail in a mode having a substantial internal resistance or in an open circuit mode, the voltage at terminal 48 becomes substantially equal to B+ during those intervals in which FET switch 216 is conductive and FET switch 240 is nonconductive. When FET switch 240 is conductive and FET switch 216 is nonconductive, the voltage at terminal 48 becomes negative. During normal operation, therefore, the forward offset voltage and the reverse voltage capability of diode 268 prevents application of any significant voltage across resistor 270. Thus, a normal operating condition is represented by a logic low on conductor 272. Under open circuit fault conditions of diode 236, diode 268 becomes conductive and couples a logic high across resistor 270 and to conductor 272 to represent the fault.

Under normal operating conditions prior to time $T_0$, control voltage 310 is LOW, FET switch 216 is ON and FET switch 240 is OFF. Node 222 is held by conductive switch 216 at the B+ voltage. Consequently, diode 260 is reverse biased and therefore nonconductive, and input terminal 253 of EXOR 226 is HIGH. Since control signal 310 applied to input terminal 225 of EXOR 226 is LOW prior to time $T_0$, EXOR 226 produces at its output terminal 227 a voltage $V_{227}$ which represents a HIGH, as illustrated by waveform 326 of FIG. 3i.

Under normal operating condition, the transition 311 from LOW to HIGH of control signal 310 at time $T_0$ renders FET switch 216 nonconductive as illustrated by current waveform 312 of FIG. 3b. Also at time $T_0$, transition 311 of control signal 310 causes a positive-going transition 313 in gate voltage 314 of FET switch 240, thereby rendering FET switch 240 fully conductive.

In the interval $T_0-T_1$ the conduction of FET switch 240 tends to pull node 222 towards B—. However, the heavy conduction due to the stored excess charge carriers in diode 236 causes a current flow through resistor 246 which maintains node 222 at a voltage 332 which is more positive than B—, as illustrated by waveform 318 of FIG. 3e. In the interval $T_0-T_1$, voltage $V_{48}$ at terminal 48 (corresponding to the voltage across diode 236) drops from its forward bias voltage of +0.7 volts to a voltage 334 slightly more positive than voltage 332, as illustrated by waveform 320 of FIG. 3f, as a result of flow of diode current $I_{236}$ of FIG. 3g through resistor 248. In the interval $T_0-T_1$, the voltage across resistor 252, diode 254 and resistor 256 reaches its maximum, whereupon diode 260 becomes conductive and limits the voltage at the cathode of diode 254 to a few tenths of a volts below ground. Consequently, input terminal 253 of EXOR 226 is at a voltage near ground, which is a LOW condition. With input terminal 253 LOW and input 225 HIGH, EXOR 226 produces a LOW voltage $V_{227}$ on terminal 227, as illustrated in the interval $T_0-T_1$ by waveform 326 of FIG. 3i. A LOW at terminal 227 if latched by latch 262 would represent a fault condition, and conversely a HIGH if latched represents normal operation. However, a LOW occurring at terminal 227 in the interval $T_0-T_1$ is a transient condition occurring during normal operation, and does not create a fault indicative signal because it is not transferred to latch 262 by a strobe signal.

Under normal conditions, the current through diode 236, resistors 246 and 248, and FET switch 240 is large enough so that the excess charge carriers are swept out of the active region of diode 236 by time $T_1$. Also, the time constant of capacitors 232 and resistor 234 of differentiator 231 is selected so that FET 240 is maintained conductive only in the interval $T_0-T_1$. Consequently, after time $T_1$ both diode 236 and FET switch 240 are nonconductive. After time $T_1$, the voltage at node 222 is established by voltage divider 250. The resistor values are selected as described below so that diode 260 remains conductive, and therefore $V_{253}$ applied to input terminal 253 of EXOR 226 remains LOW as illustrated by FIG. 3h. Strobe pulse generator 228 responds to each positive-going transition of control signal 310 to produce in the interval $T_4-T_5$ a strobe signal illustrated as 328 of FIG. 3j which is applied to latch 262 for latching the value of output voltage $V_{227}$ of EXOR 226. Wavefrom 330 of FIG. 3k illustrates voltage $V_{264}$ produced on conductor 264 by latch 262. As illustrated in FIG. 3k, at the time of the strobe signal preceding the current strobe signal, a fault signal (LOW) was latched, and at time $T_4$ the logic HIGH level of $V_{227}$ then occurring at terminal 227 is latched.

In normal operation, after time $T_4$ FET switches 216 and 240 are nonconductive, diode 236 is nonconductive, the voltage at node 222 is established by voltage divider 250, EXOR 226 produces at its output terminal a HIGH in response to a HIGH applied to its input terminal 225 and a LOW applied to input terminal 253, and latch 262 holds the latched HIGH. At later time $T_{200}$, control signal $V_{210}$ makes a negative-going transition to render FET switch 216 conductive to produce forward bias current. The further operation is obvious from the above description. It is noted that the relatively small pulse at time $T_{200}$ occurring in the voltage $V_{238}$ representing the voltage across capacitor 232 results from forward (non-zener) conduction of diode 246, which bypasses resistor 234 and allows faster charging than for a positive-going transition of control voltage $V_{210}$.

If the reverse current $I_{236}$ flowing in diode 236 immediately after time $T_0$ is not large enough, diode 236 will remain conductive for a longer interval than the period $T_0-T_1$. During this longer interval, phase shifter 8 (FIG. 1) does not operate in conformance with the control signal. Such a reduction in reverse current may occur due to a failure resulting in a reduction in conductivity of FET switch 240, overheating or opening of resistor 246, or a defect in diode 236. For purposes of explanation, assume that FET switch 240 has failed in a nonconductive mode. FIGS. 4a-4k illustrate waveforms representing the operating conditions. FIGS. 4a-4d are identical to the corresponding figures of FIG. 3 and are included for reference. With this fault condition, current $I_{236}$ decreases to 0 at time $T_0$ as illustrated by waveform 422 of FIG. 4g, as a result of interruption of forward drive current by FET switch 216. The excess charge carriers in the active region of diode 236 cause diode 236 to act as a capacitor, and the voltage $V_{48}$ at terminal 48 remains in the interval $T_0-T_7$ at the value which it had prior to time $T_0$. After time $T_7$ voltage $V_{48}$ decreases exponentially towards B− as illustrated by waveform 420 of FIG. 4f as current is bled off by resistors 248 and 258. Voltage $V_{222}$ at node 222 tracks voltage $V_{48}$ at terminal 48, as illustrated by waveform 418 of FIG. 4e. Since the voltage at node 222 remains essentially unchanged from times prior to time $T_0$ until time $T_7$, voltage $V_{253}$ applied to input terminal 253 of EXOR 226 remains at B+ until time $T_7$, and then begins to decrease at about time $T_{10}$ as illustrated by waveform 424 of FIG. 4h. As voltage $V_{222}$ at terminal 222 continues to drop in the interval $T_{10}-T_{13}$, voltage $V_{253}$ at terminal 253 of EXOR 226 drops towards its lowest voltage. At a time illustrated as time $T_{11}$, voltage $V_{253}$ passes through the threshold at which EXOR 226 switches. In the interval $T_0-T_{11}$, therefore, both terminals 225 and 253 of EXOR 226 are HIGH, and EXOR 226 produces on terminal 227 a voltage $V_{227}$ which is LOW, as illustrated by $V_{426}$ of FIG. 4i. Thus, in the interval $T_0-T_{11}$, EXOR 226 produces a fault indication level. Since strobe pulse generator 228 produces strobe pulse 428 of FIG. 4j in the interval $T_4-T_5$, latch 262 samples the fault indication level at time $T_4$. As illustrated by 430 of FIG. 4k, voltage $V_{264}$ on conductor 264 at the output of latch 262 becomes a LOW, indicative of a fault. It should be noted that the conditions resulting from an open switching FET or insufficient diode reverse current are transient, and that by time $T_{20}$ the condition of voltage at node 222 is indistinguishable from that which occurs under normal operating conditions. Consequently, monitoring of the conditions resulting in slow switching speed must be performed on a signal latched during the time the problem is evidenced.

Figure 4:
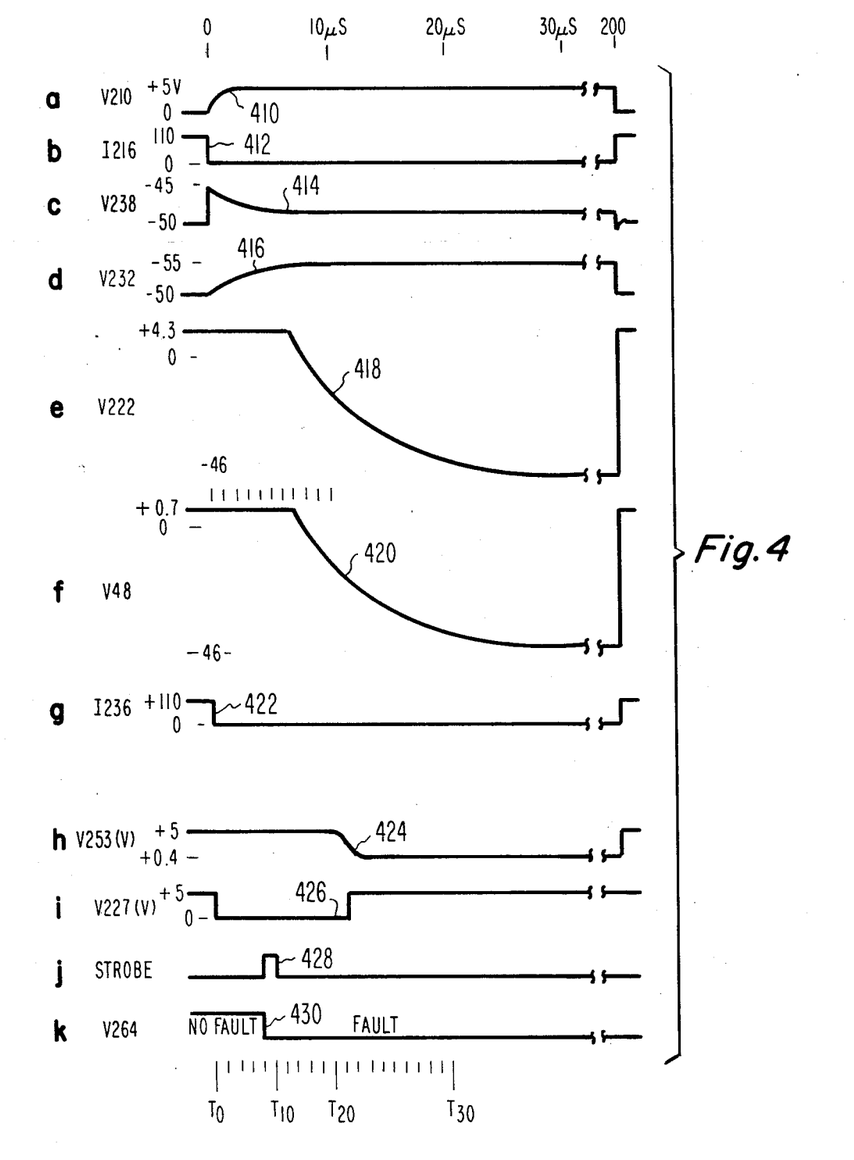

In a particular embodiment of the invention, the following components were found to provide suitable operation at the voltages and currents indicated in FIGS. 3a-3k and FIGS. 4a-4k and with each time increment $T_N-T_{N+1}$ corresponding to one microsecond:

| | |
|---|---|
| B+ | +5 V |
| B− | −50 V |
| FET 216, 240 | RFL 1P08, RFL IN08L, manufactured by RCA Solid State Division, Somerville, NJ, selected for switching operation with TTL gate voltages |
| capacitor 232 | 3300 pF |
| resistor | |
| 212 | 150 ohm |
| 230 | 19.6K ohm |
| 234 | 5.62K ohm |
| 246 | 33 ohm |
| 248 | 32.4 ohm |
| 252 | 56.2K ohm |
| 256 | 300K ohm |
| 258 | 26.1K ohm |
| 270 | 390 ohm |
| diodes 254, 268 | silicon (0.7 V fwd. drop) |
| diodes 36, 38 | TYPE MA-4P505 PIN DIODES manufactured by Microwave Associates, |

-continued

43 South Avenue,
Burlington, MA.

With these components and values, a short-circuit condition of diode 236 is detected during the time the control signal 310 is positive ($T_0$ to $T_{200}$), because with diode 236 shorted, the current through resistors 252 and 256 in that interval is only 12 μA, the cathode of diode 260 is at +3.6 V, and input terminal 253 of EXOR 226 is at +4.3 V, both of which correspond to a TTL HIGH. With both input terminals 225 and 253 HIGH, EXOR 226 responds with a LOW, respresenting a fault, which is latched at time $T_4$ to provide a fault indication signal on conductor 264 in the same manner as described above for a low current fault.

Other embodiments of the invention will be apparent to those skilled in the art. For example, controller 106 (FIG. 1) may produce its control signals in the form of modulated light signals, in which case conductor sets 108 and 110 may be fiber-optic cables, and a light-to-electrical signal transducer must be included in each driver arrangement. Zener diode 246 has an inherent capacitance which may delay the turn-on time of FET switch 240 relative to the control signal. If FET switch 240 has sufficient gate-to-source breakdown voltage capability, Zener diode 246 may be dispensed with, or alternatively the capacitance of the Zener diode may be selected to provide adequate rise time. While the illustrated embodiment uses two PIN diodes for each bit of phase shifting, more than two diodes may be used, or a single diode may be used. While current limiting resistor 248 as illustrated in FIG. 2 is connected in both the forward and reverse bias paths of the PIN diode, it may be located instead in series with FET switch 216. Lamp 226 (FIG. 2) is preferably a solid-state light emitting device, which is more reliable than conventional filament lamps. While FET switches selected for low gate operating voltages were used in the described embodiments, operation with nonselected FET switches may be used by providing greater control signal voltages. Conductor 272 may be buffered and latched, and a second lamp may be added to indicate the existence of an open-circuit fault of diode 236, if desired. Bus voltages, and resistor and capacitor values may be selected at will to provide suitable operating conditions for the various elements. Germanium or other diodes may be substituted for Schottky diode if switching speeds allow. While FET switching elements are very advantageous because of their low drive current requirements and high switching speed, other types of switches may be used. Many different types of phase shift structures may be used, as for example the distributed PIN diode phase shifter as described in U.S. patent application Ser. No. 706,752 filed Feb. 28, 1985, in the name of Rosen. The strobe signal may advantageously be generated external to an individual driver so that a single strobe signal generator may be used for a large number of drivers. While a discrete resistor 248 (FIG. 2) has been illustrated as connected in series with diode 236, some or all of the resistance respresented by resistor 248 may be in the form of intrinsic or internal resistance of FET 216, diode 236, or both. Switching diodes 36, 38; 64, 66 (FIG. 1) as illustrated are coupled to transmission line portions 24–30; 57 for both RF or microwave signals and for bias. However, the diodes may be AC coupled to the transmission line portions with the bias being applied directly to the diodes without passing into the transmission line.

What is claimed is:

1. An error sensing arrangement for a switching diode and its driver circuit for producing a signal representative of slow turnoff of said diode, said arrangement comprising:
    diode means associated with a series resistance, said diode means and its associated series resistance being coupled between first and second terminals, said second terminal being coupled to a point of reference potential;
    first and second power buses having mutually opposite polarities relative to said reference potential;
    a source of bilevel control signals having a first level and a second level;
    first switching means coupled to said first power bus, to said first terminal of said diode means and to said source of bilevel control signals for being rendered conductive by said first level of said bilevel control signal and for being rendered nonconductive by said second level of said bilevel control signal, whereby in said conductive state of said first switching means forward current flows in said diode means from said first power bus, and said diode means becomes flooded with charge carriers which must be removed before said diode means can be rendered nonconductive;
    second switching means coupled to said first terminal of said diode means, to said second power bus, and to said source of bilevel signals for being rendered conductive for at least an interval immediately following each transition of said bilevel control signal from said first to said second levels whereby in said conductive state of said second switching means a reverse current flows in said diode means from said second power bus for removing said charge carriers whereby at a predetermined time after said second switching means is rendered conductive the voltage at said first terminal of said diode means is closer to a first value than to a second value if said reverse current is low and closer to said second value than to said first value if said reverse current is high; and
    logic means coupled to said source of bilevel control signals and to said first terminal of said diode means for comparing said bilevel control signal with said voltage at said first terminal of said diode means at a predetermined time after said second switching means is rendered conductive to produce a fault indicative signal if said voltage at said first terminal of said diode means at said predetermined time is closer than a predetermined amount to said first value.

2. An arrangement according to claim 1 wherein said associated series resistance includes an inherent diode series resistance and a further discrete resistor.

3. An arrangement according to claim 1 wherein said logic means comprises:
    EXOR means including a first input terminal coupled to said source of bilevel signals and also including a second input terminal; and
    coupling means for coupling said second input terminal of said EXOR means to said first terminal of said diode means for generating at times near said predetermined time at the output of said EXOR means a fault logic level corresponding to said fault indicative signal.

4. An arrangement according to claim 3 wherein said coupling means comprises a voltage divider including a tap, said voltage divider being coupled between said first power bus and said first terminal of said diode means, and said tap being coupled to said second input terminal of said EXOR means.

5. An arrangement according to claim 4 further comprising voltage limiting means coupled to said voltage divider for limiting the voltage excursion at said tap.

6. An arrangement according to claim 5 wherein said voltage limiting means comprises a diode coupled to a point on said voltage divider and to said point of reference potential.

7. An arrangement according to claim 3 further comprising:
strobe signal generating means coupled to said source of bilevel signals for generating a strobe signal at said predetermined time after each transition of said bilevel signal from said first level to said second level; and
latch means coupled to said output of said EXOR means and to said strobe signal generating means for latching said fault logic level to generate said fault indicative signal.

8. An arrangement according to claim 7 wherein said coupling means comprises a voltage divider including a tap, said voltage divider being coupled between said first power bus and said first terminal, and said tap being coupled to said second input terminal of said EXOR means.

9. An arrangement according to claim 8 further comprising voltage limiting means coupled to said voltage divider for limiting the voltage excursion at said tap.

10. An arrangement according to claim 9 wherein said voltage limiting means comprises a diode coupled to a point on said voltage divider and to said point of reference potential.

11. An arrangement according to claim 1 wherein said second switching means comprises current limiting means.

12. An arrangement according to claim 11 wherein said current limiting means comprises resistance means.

13. A method for operating a switching diode comprising the steps of:
generating a first level of a bilevel control signal having first and second levels;
generating said second level of said bilevel control signal;
applying a first polarity of current to forward bias said diode in response to said first level of said control signal whereby charge carriers accumulate in said diode;
stopping said application of a first polarity of current, and applying a reverse bias voltage to said diode in response to said second level of said control signal, whereby a reverse current flows through said diode which is large when said charge carriers are being swept out of said diode at a proper rate and which is small when the rate at which said charge carriers are being swept out is undesirably small;
deriving a voltage from said diode; and
comparing said voltage derived from said diode with said second level of said control signal to produce a fault indicative level when said voltage derived from said diode represents said small reverse current.

14. A method according to claim 13 further comprising the step of latching said fault indicative level at a predetermined time after each transition of said control signal from said first level to said second level.

15. A phase shifter, comprising:
a transmission line adapted for carrying radio frequency or microwave signals, said transmission line having first and second conductive means;
diode means having first and second electrodes, said first electrode being coupled to said first conductive means at least for said radio frequency or microwave signals, and said second electrode being coupled to said second conductive means, at least for said radio frequency or microwave signals;
a source of direct reference potential coupled to said second electrode;
first and second direct power buses carrying voltages of mutually opposite polarities relative to said direct reference potential;
a source of bilevel control signals having first and second levels;
first switching means coupled to said first power bus, to said first electrode of said diode means, and to said source of bilevel control signals for being rendered conductive by said first level of said bilevel control signals and for being rendered nonconductive by said second level of said bilevel control signal, whereby in said conductive state of said first switching means forward current flows in said diode means from said first power bus thereby rendering said diode means highly conductive of said radio frequency or microwave signals, and said diode means becomes flooded with charge carriers which must be removed before said diode means can be rendered nonconductive;
second switching means coupled to said first electrode of said diode means, to said second power bus, and to said source of bilevel control signals for being rendered conductive for at least a first predetermined interval immediately following each transition of said bilevel control signals from said first to said second level for drawing a reverse current through said diode means for removing said charge carriers whereby if said reverse current is sufficient the voltage at said first electrode of said diode means is near the voltage of said second bus at a first predetermined time following each said transition, and if said reverse current is insufficient the voltage of said first electrode of said diode means is near the voltage of said first bus at said predetermined time; and
logic means coupled to said source of bilevel control signals and to said first electrode of said diode means for comparing the state of said bilevel control signal with said voltage at said first electrode of said diode means for generating at said predetermined time a fault indicative signal if said voltage at said first electrode of said diode means at said predetermined time is nearer to said voltage on said first bus than to said voltage on said second bus.

16. A phase shifter according to claim 15, wherein said logic means comprises:
EXOR means including a first input terminal coupled to said source of bilevel control signals and also including a second input terminal and an output terminal; and
coupling means coupled to said second input terminal of said EXOR means and to said first electrode of said diode means for generating at said output terminal of said EXOR means a fault logic level.

17. A phase shifter according to claim 16 wherein said coupling means comprises:
voltage dividing means including a tap, said voltage dividing means being coupled between said first bus and said first electrode of said diode means, said tap being coupled to said second input terminal of said EXOR means.

18. A phase shifter according to claim 17 wherein said logic means further comprises:
strobe signal generating means coupled to said source of bilevel control signals for generating a strobe signal at said predetermined time; and
latch means coupled to said output terminal of said EXOR means and to said strobe signal generating means for latching said fault logic level at said predetermined time for generating said fault indicative signal.

19. A phase shifter according to claim 17 wherein said voltage dividing means further comprises voltage limiting means coupled to a point on said voltage dividing means for limiting the voltage applied to said second input terminal of said EXOR means.

20. A phase shifter according to claim 19 wherein said voltage limiting means comprises a diode having a first electrode coupled to said point on said voltage dividing means and a second electrode coupled to said source of direct reference potential.

* * * * *